(12) United States Patent
 Xue et al.

(10) Patent No.: US 11,024,208 B2
(45) Date of Patent: Jun. 1, 2021

(54) DISPLAY SUBSTRATE, MANUFACTURING METHOD THEREOF, AND DISPLAY DEVICE

(71) Applicants: BOE Technology Group Co., Ltd., Beijing (CN); Chengdu BOE Optoelectronics Technology Co., Ltd, Chengdu (CN)

(72) Inventors: Wenqiang Xue, Beijing (CN); Fei Xie, Beijing (CN); Yang Xia, Beijing (CN); Kejiang Dai, Beijing (CN); Xiehong Zhou, Beijing (CN)

(73) Assignees: BOE TECHNOLOGY GROUP CO., LTD., Beijing (CN); CHENGDU BOE OPTOELECTRONICS TECHNOLOGY CO., LTD, Chengdu (CN)

( * ) Notice: Subject to any disclaimer, the term of this patent is extended or adjusted under 35 U.S.C. 154(b) by 117 days.

(21) Appl. No.: 15/966,535

(22) Filed: Apr. 30, 2018

(65) Prior Publication Data
US 2019/0057634 A1    Feb. 21, 2019

(30) Foreign Application Priority Data

Aug. 16, 2017  (CN) .......................... 201710700774.9

(51) Int. Cl.
| | | |
|---|---|---|
| *H01L 27/32* | (2006.01) | |
| *G09G 3/20* | (2006.01) | |
| *H01L 51/56* | (2006.01) | |
| *H01L 51/52* | (2006.01) | |

(52) U.S. Cl.
CPC ........... *G09G 3/20* (2013.01); *H01L 51/5253* (2013.01); *H01L 51/56* (2013.01); *H01L 27/3276* (2013.01)

(58) Field of Classification Search
None
See application file for complete search history.

(56) References Cited

U.S. PATENT DOCUMENTS

| | | | | |
|---|---|---|---|---|
| 9,829,749 | B2* | 11/2017 | Kim | .................. G02F 1/133351 |
| 10,459,295 | B2* | 10/2019 | Jeong | ................ G02F 1/133351 |
| 2003/0137325 | A1* | 7/2003 | Yamazaki | ............. H01L 27/322 |
| | | | | 327/80 |

(Continued)

FOREIGN PATENT DOCUMENTS

| | | |
|---|---|---|
| CN | 105977400 A | 9/2016 |
| CN | 106783926 A | 5/2017 |

(Continued)

OTHER PUBLICATIONS

Chinese Office Action for corresponding CN application 201710700774.9 dated Aug. 28, 2018.

*Primary Examiner* — Michelle Mandala
(74) *Attorney, Agent, or Firm* — Arent Fox LLP; Michael Fainberg

(57) ABSTRACT

The present disclosure provides a display substrate, a manufacturing method thereof and a display device, belonging to the technical field of displaying. The display substrate includes a display area and a wiring area. The manufacturing method includes: forming a barrier structure at least between the wiring area and the display area; and forming a rheological organic material in the wiring area, so that the rheological organic material levels in the wiring area to form a protective film covering the wiring area.

5 Claims, 1 Drawing Sheet

(56) References Cited

U.S. PATENT DOCUMENTS

| | | | | |
|---|---|---|---|---|
| 2006/0158114 | A1* | 7/2006 | Moon | H01J 11/12 |
| | | | | 313/582 |
| 2006/0256267 | A1* | 11/2006 | Bone | G02F 1/133553 |
| | | | | 349/122 |
| 2007/0216830 | A1* | 9/2007 | Hoshino | G02F 1/1334 |
| | | | | 349/86 |
| 2017/0102569 | A1* | 4/2017 | Kim | H01L 27/124 |
| 2017/0179423 | A1 | 6/2017 | Kwon et al. | |
| 2017/0244061 | A1 | 8/2017 | Jin et al. | |
| 2018/0224688 | A1 | 8/2018 | Chen et al. | |

FOREIGN PATENT DOCUMENTS

| | | |
|---|---|---|
| CN | 106887186 A | 6/2017 |
| WO | 2016052869 A1 | 4/2016 |

\* cited by examiner

DISPLAY SUBSTRATE, MANUFACTURING METHOD THEREOF, AND DISPLAY DEVICE

CROSS-REFERENCE TO RELATED APPLICATIONS

This application claims the priority to Chinese Patent Application No. 201710700774.9, filed on Aug. 16, 2017, the content of which is hereby incorporated by reference in its entirety.

FIELD

The present disclosure relates to the technical field of displaying, and particularly to a display substrate, a manufacturing method thereof, and a display device.

BACKGROUND

With the continuous advancement of science and technology, people's pursuit of beauty has become increasingly strong, and the development and maturation of the narrow-border technology, even borderless technology, for display devices are imminent.

Due to the structure of a display device product, in order to achieve a borderless design, the wiring area (including a COF (Chip On Film) and an FPC (Flexible Printed Circuit)) of a display substrate must be folded to the back of the display substrate.

SUMMARY

An embodiment of the present disclosure provides a method for manufacturing a display substrate. The display substrate includes a display area and a wiring area. The method includes: forming a barrier structure at least between the wiring area and the display area; and forming a rheological organic material in the wiring area, so that the rheological organic material levels in the wiring area to form a protective film covering the wiring area.

Optionally, the forming a barrier structure at least between the wiring area and the display area includes: forming a barrier structure that surrounds the wiring area; or forming a barrier structure between the wiring area and the display area.

Optionally, the forming the barrier structure includes: coating the rheological organic material onto a barrier area where the barrier structure is to be formed, and irradiating the display substrate with ultraviolet light to cure the rheological organic material in the barrier area to form the barrier structure.

Optionally, the forming a rheological organic material in the wiring area includes: spraying simultaneously a plurality of rheological organic material lines in the wiring area through an adhesive spray valve.

Optionally, before the forming a barrier structure at least between the wiring area and the display area, the method further includes: performing plasma cleaning on the display substrate.

Optionally, the display substrate is a flexible display substrate, and after forming a protective film covering the wiring area, the method further includes: folding the wiring area over to a side, departing from a display side, of the display substrate.

An embodiment of the present disclosure further provides a display substrate, which is manufactured using the above-mentioned manufacturing method, and a wiring area of the display substrate is covered with a protective film.

Optionally, an edge of a display area of the display substrate is close to an edge of the display substrate.

Optionally, the wiring area is located on a side, departing from a display side, of the display substrate.

An embodiment of the present disclosure further provides a display device including the display substrate as described above.

DETAILED DESCRIPTION OF THE EMBODIMENTS

In order to make the technical problem to be solved, the technical solutions and advantages of the embodiments of the present disclosure more clear, the embodiments of the present disclosure will be described further in detail below with reference to the accompanying drawings.

In the related art, in order to increase the strength of the folded part, it is necessary to coat the wiring area with a layer of protective adhesive, and the folded part protected by the protective adhesive can withstand the folding and may not be damaged.

At present, when coating the protective adhesive, multiple adhesive lines are simultaneously sprayed in the wiring area through an adhesive spray valve, and the adhesive lines are automatically leveled and cured in the wiring area to form a protective film, but due to the good fluidity of the protective adhesive, the area of the formed protective film is relatively large. In order to prevent the adhesive line from diffusing into a display area, a relatively large space needs to be reserved at the edge of the display substrate to form a protective film, which is disadvantageous for realizing the narrow-border and borderless designs of the display device.

In order to address the problem in the related art that: in order to prevent the adhesive lines from diffusing into the display area, a relatively large space needs to be reserved at the edge of the display substrate to form a protective film, which is disadvantageous for achieving the narrow-border and borderless designs of display devices, the embodiment of the present disclosure provides a display substrate, a manufacturing method thereof and a display device, to realize the narrow-border design, even the borderless design, of display devices.

An embodiment of the present disclosure provides a method for manufacturing a display substrate. The display substrate includes a display area and a wiring area. The manufacturing method includes the following steps.

Forming a barrier structure at least between the wiring area and the display area.

Forming a rheological organic material in the wiring area, so that the rheological organic material levels in the wiring area to form a protective film covering the wiring area.

In the embodiment, a barrier structure is formed between the wiring area and the display area of the display substrate, and then when the rheological organic material is formed in the wiring area, the barrier structure can prevent the rheological organic material from diffusing into the display area, therefore it is not necessary to reserve a relatively large space on the edge of the display substrate to form a protective film, and the distance between the edge of the display area and the edge of the display substrate can be reduced, which is advantageous to realize the narrow-border and borderless designs of the display devices.

Figure 1:
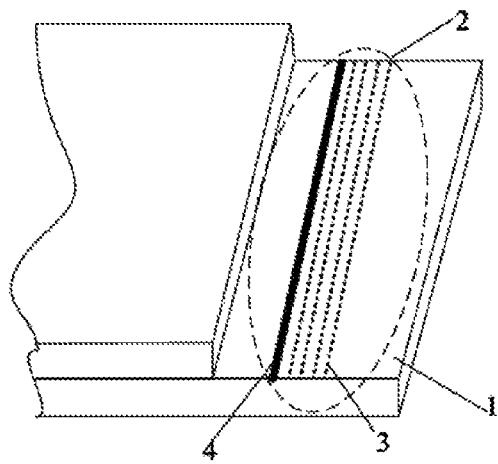
FIG. 1 is a structural schematic diagram of a display substrate according to an embodiment of the present disclosure.

In a specific embodiment, a barrier structure may be formed only between the wiring area and the display area of the display substrate to prevent the rheological organic material in the wiring area from diffusing into the display area. As shown in FIG. 1, a display element is formed in a display area of a substrate 1, where a wiring area is labeled as 2, and a barrier structure between the wiring area 2 and the display area is labeled as 4.

Figure 2:
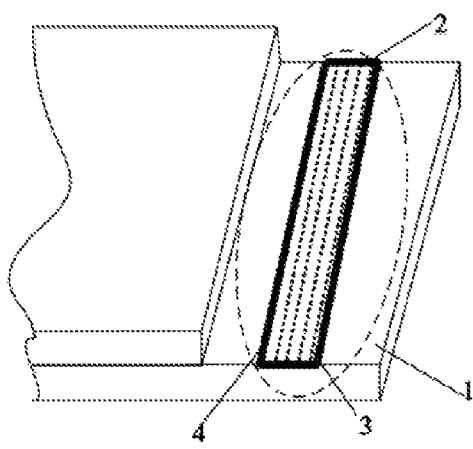
FIG. 2 is a structural schematic diagram of a display substrate according to another embodiment of the present disclosure.

In another specific embodiment, a barrier structure surrounding the wiring area may also be formed so as to confine the rheological organic material within the wiring area. As shown in FIG. 2, a display element is formed in a display area of a substrate 1, where a wiring area is labeled as 2, and a barrier structure between the wiring area 2 and the display area is labeled as 4, and the barrier structure 4 is not only located between the wiring area and the display area but also surrounds the entire wiring area 2.

In a specific embodiment, the barrier structure may be formed using a rheological organic material that forms a protective film. The barrier structure can be formed as follows.

Coating the rheological organic material onto a barrier area where the barrier structure is to be formed, and meanwhile irradiating the display substrate with ultraviolet light to cure the rheological organic material in the barrier area to form the barrier structure.

Of course, the barrier structure may also be formed in other ways. For example, a layer of insulating material is deposited on a display substrate, and the deposited insulating material is patterned to form a barrier structure; or, a barrier structure is directly formed on the display substrate by printing.

When coating a rheological organic material and curing the coated rheological organic material under the irradiation of ultraviolet light to form a barrier structure, in order to prevent the performance of the display substrate from being affected by the ultraviolet light reaching the display area, the barrier structure may be spaced from the edge of the display area by a certain distance, for example, the distance of 50-200 um.

Further, forming a rheological organic material in the wiring area includes the following step.

Spraying simultaneously a plurality of rheological organic material lines in the wiring area through an adhesive spray valve.

As shown in FIG. 1 and FIG. 2, when the rheological organic material is a protective adhesive, a plurality of adhesive lines 3 can be sprayed in the wiring area through the adhesive spray valve. Spraying simultaneously a plurality of adhesive lines 3 can improve the coating efficiency of the protective adhesive and helps to form a protective film faster.

Further, before forming a barrier structure at least between the wiring area and the display area, the method further includes the following step.

Performing plasma cleaning on the display substrate so that residual particles and impurities on the display substrate can be removed to avoid contaminating the rheological material.

Further, the display substrate is a flexible display substrate, and after forming a protective film covering the wiring area, the method further includes the following step.

The wiring area is folded over to a side, departing from a display side, of the display substrate, such that the wiring area may not occupy the layout space of the display side of the display substrate, and the narrow-border or borderless design of the display substrate can be realized.

In a specific embodiment, the method for manufacturing a display substrate of the present disclosure specifically includes the following steps.

S1, a display substrate with a display element is placed on an operating table, and is cleaned with plasma after alignment.

Wiring, thin film transistors and a light emitting unit have been already formed on the display substrate. The display substrate is divided into a display area and a wiring area. Performing plasma cleaning on the display substrate can remove residual particles and impurities on the display substrate, thus preventing the residual particles and impurities from contaminating the rheological material in the subsequent process.

S2, a barrier structure is formed between the display area and the wiring area of the display substrate.

Specifically, a UV adhesive can be used to form a barrier structure. A UV adhesive line is coated on a side of the wiring area near the display area, and while coating, the coated UV adhesive line is cured using a UV lamp fixed behind a spray valve to form a barrier structure. In order to prevent the ultraviolet light from irradiating the display area and affecting the performance of the display substrate, the barrier structure may be spaced from the edge of the display area by a certain distance, for example, the distance of 50-200 μm.

Further, the barrier structure may also not only be located between the display area and the wiring area, but also may be in the form of a closed frame that surrounds the entire wiring area.

S3, the UV adhesive is coated in the wiring area.

A plurality of UV adhesive lines is spayed simultaneously in the wiring area through the spray valve. UV adhesive lines extend from a side of the wiring area to the opposite side; after the completion of coating, the UV adhesive lines stand still for a while to get leveled automatically to obtain a flat surface.

S4, the UV adhesive in the wiring area is irradiated with ultraviolet light to form a protective film covering the wiring area.

After the flattening of the UV adhesive in the wiring area is completed, the UV lamp is used to cure the UV adhesive in the wiring area as a whole to form a protective film covering the wiring area.

Afterwards, the wiring area can also be folded over to the side, departing from the display side, of the display substrate. Since the protective film is formed in the wiring area, the strength of the wiring area can be enhanced to protect the wiring area from being damaged due to repeat folding.

An embodiment of the present disclosure further provides a display substrate manufactured using the above-mentioned manufacturing method, and a wiring area of the display substrate is covered with a protective film.

In the embodiment, a barrier structure is formed between the wiring area and the display area of the display substrate, and then when the rheological organic material is formed in the wiring area, the barrier structure can prevent the rheological organic material from diffusing into the display area, therefore it is not necessary to reserve a relatively large space on the edge of the display substrate to form a protective film, and the distance between the edge of the display area and the edge of the display substrate can be reduced, which is advantageous to realize the narrow-border and borderless designs of the display devices.

Further, the edge of the display area of the display substrate is close to the edge of the display substrate. A barrier structure is formed between the wiring area and the display area of the display substrate, and the barrier structure can prevent the rheological organic material from diffusing into the display area; therefore, it is not necessary to reserve a relatively large space on the edge of the display substrate to form a protective film, and the distance between the edge of the display area and the edge of the display substrate can be designed relatively small, for example, the distance between the edge of a display area of the display substrate and the edge of the display substrate is less than a preset value, and the preset value may be 300 um.

Further, the wiring area is located on a side, departing from the display side, of the display substrate. Since the wiring area is folded over to the side, departing from the display side, of the display substrate after the formation of the protective film covering the wiring area, the wiring area may not occupy the layout space of the display side of the display substrate so that the distance between the edge of the display area and the edge of the display substrate can be designed relatively small, and the narrow-border or borderless design of the display substrate can be realized.

An embodiment of the present disclosure further provides a display device including the display substrate as described above. The display device may be any product or component having a display function, such as a television, a display, a digital photo frame, a mobile phone, a tablet computer, etc., wherein the display device further includes a flexible circuit board, a printed circuit board and a backboard.

It should be noted that the display substrate in the present disclosure can be an Organic Light-Emitting Diode (OLED) display substrate.

In each method embodiment of the present disclosure, the order numbers of the steps cannot be used to limit the order of the steps. For those skilled in the art, the changes in the order of the steps, made without paying any creative labor, also fall within the scope of the present disclosure.

Unless defined otherwise, technical terms or scientific terms used in the present disclosure should be commonly understood by those of ordinary skill in the field to which the present disclosure belongs. Words, such as "first" and "second", used in the present disclosure do not denote any order, quantity, or importance, but are merely for distinguishing different components. The word, such as "including" or "comprising", means that a component or item prior to the word encompasses any component or item listed after the word or its equivalent, and does not exclude other components or items. The word, such as "connect" or "connected with", is not limited to physical or mechanical connections, but may include electrical connections, whether direct or indirect. Words, such as "up," "down," "left" and "right", are used only to indicate relative positional relationships. When the absolute position of the described object changes, the relative positional relationship may also change accordingly.

It should be understood that when a component, such as a layer, film, area, or substrate, is referred to as placed "on" or "under" another component, it can be directly "on" or "under" another component, or there may be a component therebetween.

The preferred embodiments are described as above. It should be noted that for the person of ordinary skill in the art, several improvements and modifications also may be made without departing from the principles of the present disclosure, and these improvements and modifications also should be considered as falling within the protection scope of the present disclosure.

The invention claimed is:

1. A method for manufacturing a display substrate comprising a display area and a wiring area, wherein a distance between an edge of the display area and an edge of the display substrate is less than 300 um, and
wherein the method comprises:
forming a barrier structure at least at a non-display area on a side of the wiring area facing the display area; and
forming a rheological organic material in the wiring area, so that the rheological organic material levels in the wiring area to form a protective film covering the wiring area;
wherein the forming a barrier structure at least at the non-display area on the side of the wiring area facing the display area comprises:
forming a barrier structure that surrounds the wiring area, and spaced from the edge of the display area by a distance from 50 um to 200 um;
wherein the forming the barrier structure comprises:
coating the rheological organic material onto a barrier area where the barrier structure is to be formed, and irradiating the display substrate with ultraviolet light to cure the rheological organic material in the barrier area to form the barrier structure; and
wherein the display substrate is a flexible display substrate, and after forming a protective film covering the wiring area, the method further comprises:
folding the wiring area over to a side, departing from a display side, of the display substrate.

2. The method according to claim 1, wherein the forming a rheological organic material in the wiring area comprises:
spraying simultaneously a plurality of rheological organic material lines in the wiring area through an adhesive spray valve.

3. The method according to claim 1, wherein before forming a barrier structure at least at a non-display area on a side of the wiring area facing the display area, the method further comprises:
performing plasma cleaning on the display substrate.

4. A display substrate, wherein the display substrate is a flexible display substrate, manufactured using the method according claim 1, and
the display substrate comprises a display area and a wiring area;
wherein a distance between an edge of the display area and an edge of the display substrate is less than 300 um;
a barrier structure is formed at least at a non-display area on a side of the wiring area facing the display area, surrounds the wiring area, and spaced from the edge of the display area by a distance from 50 um to 200 um; and
the wiring area of the display substrate is covered with a protective film, and located on a side, departing from a display side, of the display substrate.

5. A display device, comprising the display substrate according to claim 4.

* * * * *